United States Patent [19]

Birang

[11] Patent Number: 5,097,430

[45] Date of Patent: Mar. 17, 1992

[54] METHOD AND APPARATUS FOR DISPLAYING PROCESS END POINT SIGNAL BASED ON EMISSION CONCENTRATION WITHIN A PROCESSING CHAMBER

[75] Inventor: Manoocher Birang, Los Gatos, Calif.

[73] Assignee: Applied Materials, Inc., Santa Clara, Calif.

[21] Appl. No.: 464,836

[22] Filed: Jan. 16, 1990

[51] Int. Cl.⁵ ................... G06F 15/20; H01L 21/306
[52] U.S. Cl. ................................. 364/572; 364/487;
364/521; 364/734; 340/722; 324/121 R;
204/298.32; 156/626; 156/643; 395/140
[58] Field of Search ............. 364/572, 734, 518, 521,
364/487; 204/192.3, 298.32; 324/121 R;
340/722; 156/626, 627, 643

[56] References Cited

U.S. PATENT DOCUMENTS

| | | | |
|---|---|---|---|
| 4,479,848 | 10/1984 | Otsubo et al. | 156/626 |
| 4,675,072 | 6/1987 | Bennett et al. | 156/626 |
| 4,700,311 | 10/1987 | Tributsch et al. | 156/627 |
| 4,789,953 | 12/1988 | Gerrath | 364/734 |
| 4,846,928 | 7/1989 | Dolins et al. | 156/626 |
| 4,847,792 | 7/1989 | Barna et al. | 156/626 |

FOREIGN PATENT DOCUMENTS 63-187366  8/1988  Japan.

Primary Examiner—Parshotam S. Lall
Assistant Examiner—V. Trans
Attorney, Agent, or Firm—Douglas L. Weller

[57] ABSTRACT

A method facilitates the display of a filtered signal which represents the variation of light intensity in a processing chamber over time. The filtered signal filters out the effects of a magnetic field which causes plasma within the processing chamber to rotate. The magnetic field is generated by a signal with a period T. Light intensity within the process chamber is detected to produce a voltage signal with a voltage amplitude which varies based on the light intensity within the process chamber. The voltage amplitude of the voltage signal is digitally sampled at a sampling interval to obtain sample values. Running averages of a preselected number of sample values are calculated. The period T is set equal to the preselected number of sample values times the sampling interval times an integer. For each newly displayed running average, a rectangular box may be superimposed over a graph of the running averages in order to graphically display changes in slope. The computer is programmed to look for an anticipated sequence of slopes.

15 Claims, 22 Drawing Sheets

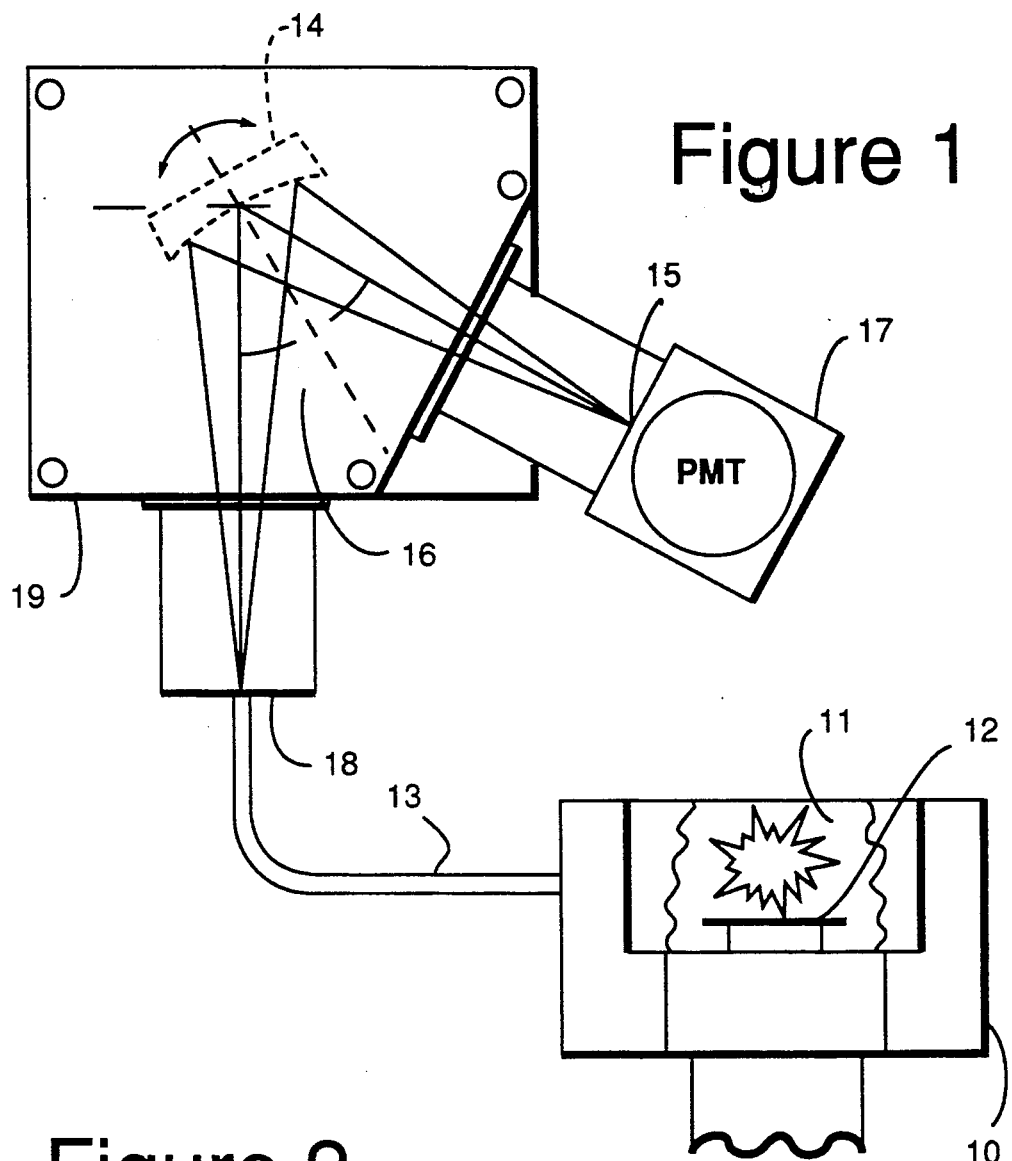

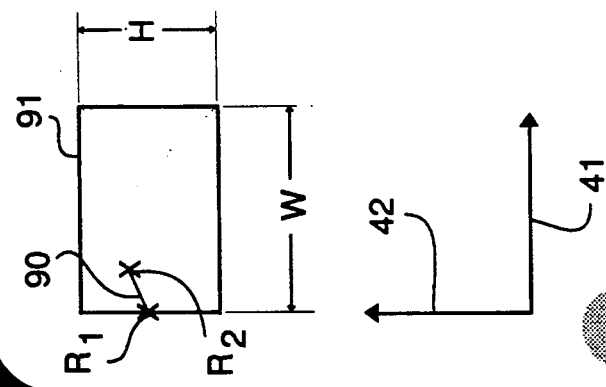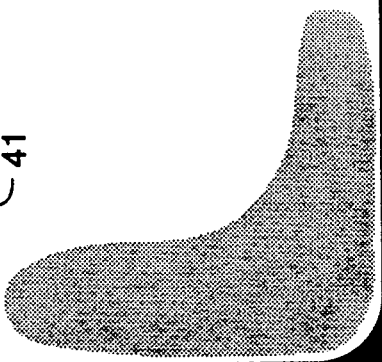
Figure 6

METHOD AND APPARATUS FOR DISPLAYING PROCESS END POINT SIGNAL BASED ON EMISSION CONCENTRATION WITHIN A PROCESSING CHAMBER

BACKGROUND

The present invention concerns real time and off line signal processing of a signal indicating plasma concentration within a processing chamber.

In a processing chamber, for example an etch chamber used for performing a reactive ion etch in the presence of a rotating magnetic field, the concentration of plasma within the processing chamber is monitored to determine the end point of the process. Light intensity within the processing chamber is monitored using a photo multiplier tube (PMT). The light intensity from the glow of the plasma is proportional to concentration of plasma within the processing chamber. The PMT generates an electrical signal with a voltage which is proportional to the light intensity. This signal is amplified and forwarded to a computer. The computer uses the signal to determine the end point of the process, i.e., when processing is to be stopped.

When a rotating magnetic field is used in the process, this causes plasma in the processing chamber to circulate. The circulation of plasma causes significant variations in the light intensity measured by the PMT. In order to accurately determine the end point of the process, the computer needs to filter the signal from the PMT to remove the noise caused by effects of the circulation. Further it is desirable to generate a display to a user which represents the method by which the computer determines the end point of the process.

SUMMARY OF THE INVENTION

In accordance with the preferred embodiment of the present invention, a method is presented for displaying a filtered signal which represents the variation of light intensity in a processing chamber over time. The filtered signal filters out the effects of a magnetic field which causes plasma within the processing chamber to rotate. The magnetic field is generated by a signal with a period T. Light intensity within the process chamber is detected to produce a voltage signal with a voltage amplitude which varies based on the light intensity within the process chamber. The voltage amplitude of the voltage signal is digitally sampled at a sampling interval to obtain sample values. Running averages of a preselected number of sample values are calculated. The period T is set equal to the preselected number times the sampling interval times an integer.

For each newly displayed running average, a rectangular box having a height H and a width W may be superimposed over a graph of the running averages in order to graphically display changes in slope. When a newly displayed running average exits to the right of the rectangular box, the graph is considered to have a zero slope. When a newly displayed running average is below the rectangular box, the graph is considered to have a positive slope. When a newly displayed running average is below the rectangular box, the graph is considered to have a negative slope.

The computer is programmed to look for an anticipated sequence of slopes. For example, the computer may look for a negative slope, followed by a zero slope, followed by a positive slope, followed by a zero slope. The computer knows it has found a slope from the anticipated sequence of slopes when the graph for a preprogrammed number of running averages is seen to have that slope. For example, if the computer is looking for a negative slope and the preprogrammed number is two, when two successive running averages are below their respective rectangular boxes, then the computer detects that the computer has detected the negative slope. The computer highlights the rectangular box for the running average at which the slope was detected. The highlighting may be done, for example, by changing the color of the box. The highlighted rectangular boxes are not erased. When a new rectangular box is displayed, prior rectangular boxes which have not been highlighted are erased.

Once the computer has detected a slope from the sequence of anticipated slopes, it begins to look for the next slope in the sequence of anticipated slopes.

For the first few running averages, the rectangular box is placed so that the first running average bisects a left side of the rectangular box. When a change of slope is detected, a new rectangular box is placed at the point of the exit from the prior rectangular box so that the point of exit from the old rectangular box bisects the left side of the new rectangular box.

BRIEF DESCRIPTION OF THE DRAWINGS

FIG. 1 is a block diagram of a system used to detect light intensity within an etch chamber in accordance with the preferred embodiment of the present invention.

FIG. 2 is a block diagram of a system which provides a signal to a computer based on the light intensity within the etch chamber detected by the system shown in FIG. 1.

FIG. 6 through FIG. 23 illustrate the box method of measuring the slope of a displayed signal by giving an example of the use of the box method in accordance with the preferred embodiment of the present invention.

DESCRIPTION OF THE PREFERRED EMBODIMENT

Figure 3:
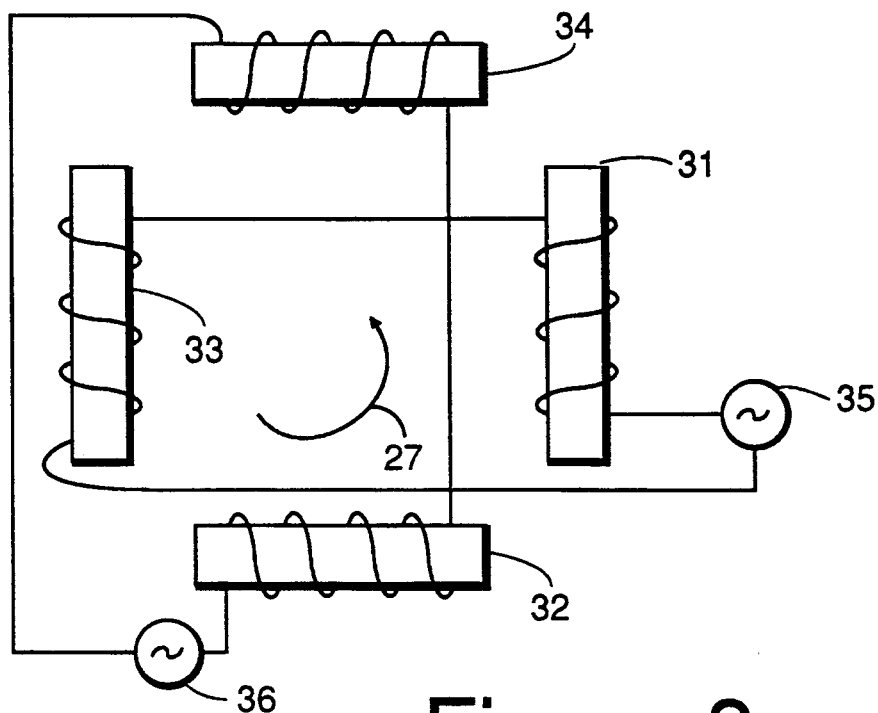
FIG. 3 is a block diagram of coils which create a magnetic field within the etch chamber shown in FIG. 1 in accordance with the preferred embodiment of the present invention.

In FIG. 1, wafers to be processed are placed upon a wafer table 12 within an etch chamber 10. Light generated by plasma within an inner region 11 of etch chamber 10 is carried through an optical fiber 13 to an entrance slit 18 of an optical chamber 19. Light from entrance slit 18 is reflected by a concave holographic grating 14 to an exit slit 15. The dimensions of entrance slit 18 and exit slit 15 and/or the angle of concave holographic grating 14 may be adjusted. The holographic grating 14 serves to separate the wavelength of light from fiber optic 13 through entrance slit 18 in order to monitor the concentration of a single element within inner region 11 of etch chamber 10. A photo multiplier tube (PMT) 17 receives light from exit slit 15 and converts the light intensity to an electrical signal.

As shown in FIG. 2, the electrical signal from PMT 17 is amplified by a pre-amplifier 24. A voltage-to-frequency converter 25 generates a signal with a frequency which varies with the voltage of the signal that voltage-to-frequency converter 25 receives from pre-amplifier 24. The signal from voltage-to-frequency converter 25 is fed to a counter 26. A computer 21 regularly reads the value of counter 26, thus receiving a digital value representing the intensity of the light signal received by PMT 17. Counter 26 may be, for example, a 16 bit counter read by computer 21 every twenty milliseconds.

The anode potential of PMT 17, and thus the gain of the system, is controlled by the voltage of a signal generated by power supply 23. The voltage of the signal generated by power supply 23 is controlled by computer 21 through a digital-to-analog converter 22.

Outside region 11 of etch chamber 10, a coil 31, a coil 32, a coil 33 and a coil 34 are used to generate a magnetic field. A first signal having the form "A sin($2\pi/T$)t" is generated by a signal generator 35 and a second signal have the form "A cos($2\pi/T$)t" is generated by a signal generator 36, where "T" represents the period of the first signal and the second signal and "t" represents time. The first signal circulating through coil 31 and coil 33 and the second signal circulating through coil 32 and 34 cause plasma within inner region 11 of etch chamber 10 to rotate in a direction 37 as shown.

Figure 4:
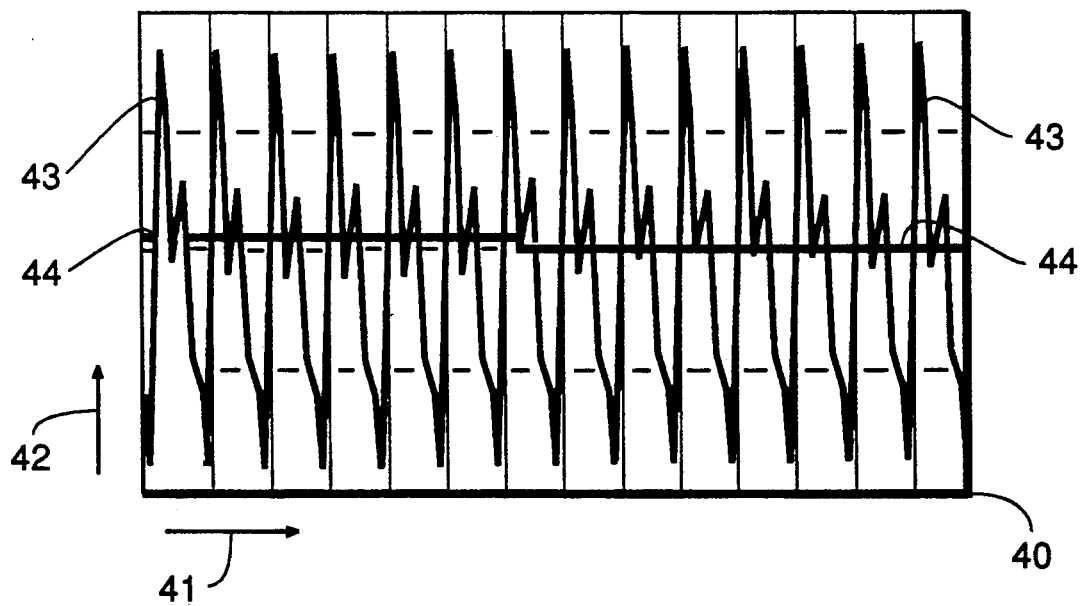
FIG. 4 is a graph which compares the signal provided to the computer by the system shown in FIG. 2 before and after filtering by the computer in accordance with the preferred embodiment of the present invention.

FIG. 4 shows an unfiltered signal 43 received by computer 21. Unfiltered signal 43 is on a graph which records intensity along an axis 42 and passage of time along an axis 41. The periodic variation in signal 43 results from the rotation of the plasma within etch chamber 10. Computer 21 filters signal 43 to produce a filtered signal 44 which represents concentration of plasma within etch chamber 10.

Filtering signal 43 is done as follows. Computer 21 secures a sample with eighteen bit resolution every one-tenth second. In the preferred embodiment computer 21 samples and clears a 16-bit counter 26 every 25 milliseconds. Computer 21 reads counter 26 four times and sums the results to obtain every one-tenth second a sample value "$S_x$" with eighteen bit resolution. Computer 21 calculates a running average "$R_y$" of a preselected number "N" of sample values ($S_x$), where y is an integer representing the current running average being calculated and, for each $R_y$, x is an integer varying from y to y+(N−1). Specifically:

$$R_1 = (S_1 + S_2 + \ldots + S_N)/N;$$
$$R_2 = (S_2 + S_3 + \ldots + S_{N+1})/N;$$
$$R_3 = (S_3 + S_4 + \ldots + S_{N+2})/N;$$
$$\vdots$$
$$R_i = (S_i + S_{i+1} + \ldots + S_{N+i})/N;$$

and so on.

The filtering algorithm works best when the period T of the first and second signal, as defined above, is an integer multiple of N times the sampling interval (I). That is:

$$T = k*(N*I), \text{ where } k = 1, 2, 3, \ldots.$$

Figure 5:
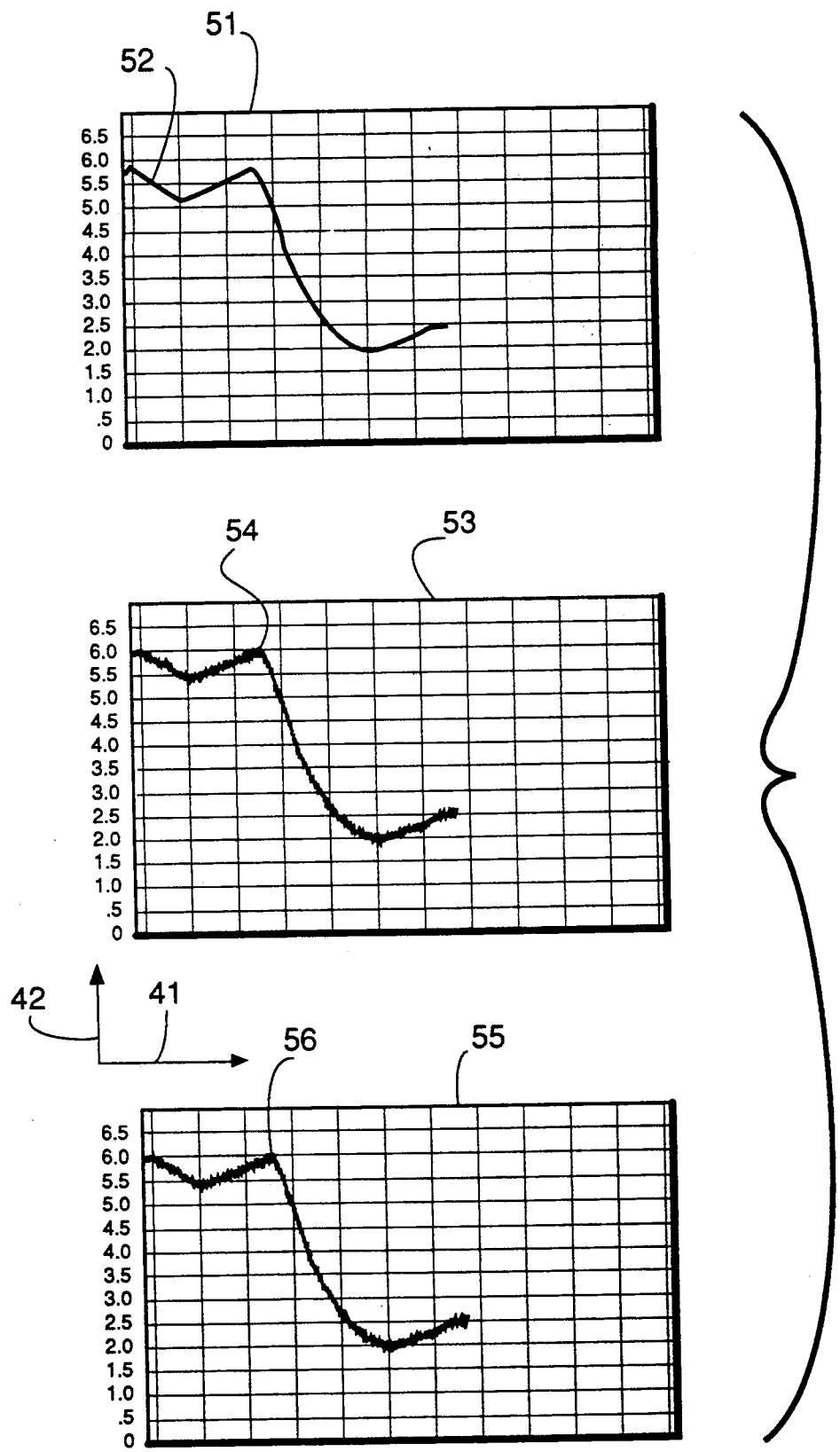
FIG. 5 shows how variation in the number of samples used to calculate running averages affects resolution of a displayed signal representing light intensity with the etch chamber in accordance with the preferred embodiment of the present invention.

FIG. 5 shows how filtering becomes less than optimal when the above algorithm is varied. A filtered signal 52 on graph 51 is calculated by computer 21 using the above optimal filtering algorithm and a value for k of 1.0. A filtered signal 54 on a graph 53 is calculated by computer 21 setting k to the value of 1.05. A filtered signal 56 on a graph 55 is calculated by computer 21 setting k to the value of 0.95. The filtering algorithm is optimized when k is an integer.

In the preferred embodiment of the present invention, a graph of the filtered signal is displayed by computer 21. This may be done in real time, as data is generated. Alternately, the data may be stored in a file and retrieved for use at a later time by computer 21.

Computer 21 utilizes the slope of the filtered signal to make processing decisions. For example, when the slope of the unfiltered signal is a particular value, computer 21 may determine that an end point of a process within etch chamber 10 has been reached. For the ease of a user, a box may be superimposed over the display of the unfiltered signal. This graphically shows a user how and when computer 21 detects critical points, for example an end point, of a process. FIGS. 6 through 23 illustrate this.

In FIG. 6, a box 91 of width W and height H is shown superimposed over a display of a filtered signal 90. Width W is measured in seconds and height H is measured in light intensity. Points within filtered signal 90 show the value of a running average of light intensity as the running average varies over time. Running averages $R_1$ and $R_2$ are shown. In real time systems, a running average may be displayed, for example, every one-tenth second. In FIG. 6, however, a relatively large distance exists between $R_1$ and $R_2$ in order to facilitate discussion of the operation of displayed boxes. In real time systems, a $R_1$ and $R_2$ would be spaced much closer together and resolution of signal 90 would be far greater.

In a real time system running averages ($R_y$) represent the calculated running average of light intensity as defined above. In a real time process these running averages are displayed sequentially by computer 21.

Upon display of $R_1$, box 91 is displayed by computer 21. Box 91 is placed so that the center of the left side of box 91 is at $R_1$. Box 91 remains displayed until signal 90 exits box 91. If signal 90 exits on the right side of box 91, signal 90, at the point of exit is considered to have a zero slope. If signal 90 exits on the bottom of box 91, signal 90, at the point of exit is considered to have a negative slope. If signal 90 exits on the top side of box 91, signal 90, at the point of exit is considered to have a positive slope. As long as $|R_1 - R_2| < H/2$, $R_2$ will remain in box 91. For the purposes of the present invention, when $R_2$ is in box 91, the signal at $R_2$ is considered to have zero slope. If $R_1 < R_2 - H/2$ then $R_2$ will be above box 91 and the slope of signal 90 at $R_2$ will be considered to be positive. If $R_1 > R_2 + H/2$ then $R_2$ will be below box 91 and the slope of signal 90 at $R_2$ will be considered to be negative.

Starting with running average $R_2$ and continuing for each running average thereafter, computer 21 is programmed to wait for either a zero, positive or negative slope. For example, since $R_2$ is within box 91, and is not at the right side of box 91, signal 90 is not exiting box 90 yet so there is no slope. If computer 21 were programmed to wait for a zero slope, computer 21 would have to wait until signal 90 came to the edge of box 91. Box 91 would then be highlighted and left unerased. Computer 21 would then start a new box at the point of exit of signal 90 and look for the next programmed condition, if any. When the next running average was displayed, a new box would have been displayed so that the center of the left side of the new box would have been at the exit point of box 91.

In the present example, however, computer 21 is programmed to look first for a negative slope. After the negative slope has been found, then computer 21 is programmed to look for a zero slope. Highlighted boxes will mark the place where first the negative slope and then the zero slope is found. When the zero slope is found after the negative slope, this signifies the end point of a process.

Figure 7:
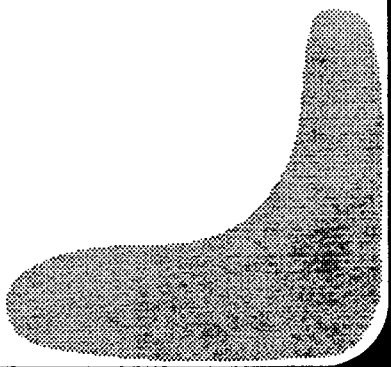

In FIG. 7, a running average $R_3$ is displayed. When $R_3$ is displayed, box 91 is not erased since $R_3$ is not to the right of the right side of box 91. As long as $|R_1-R_3| < H/2$, then $R_3$ will not exit the top or the bottom of box 91. As long as the number of running averages calculated since entering box 91 ($Y_{91}$) times the sampling interval (I) is less than box width (W), signal 90 will not exit the right hand side of box 91. If $R_1 < R_3 - H/2$ then $R_3$ will be above box 91 and the slope of signal 90 will be considered to be positive. If $R_1 > R_3 + H/2$ then $R_3$ will be below box 91 and the slope of signal 90 will be considered to be negative. Since the slope at $R_3$ is not negative (i.e., as long as it is positive or zero), computer 21 will continue to the process as below described. However, had $R_3$ been below box 91, then box 91 would have been highlighted and remain unerased. When the next running average would have been displayed, a new box would have been displayed so that the center of the left side of the new box would have been at the point ($R_3$) at which signal 90 exited box 91.

Figure 8:
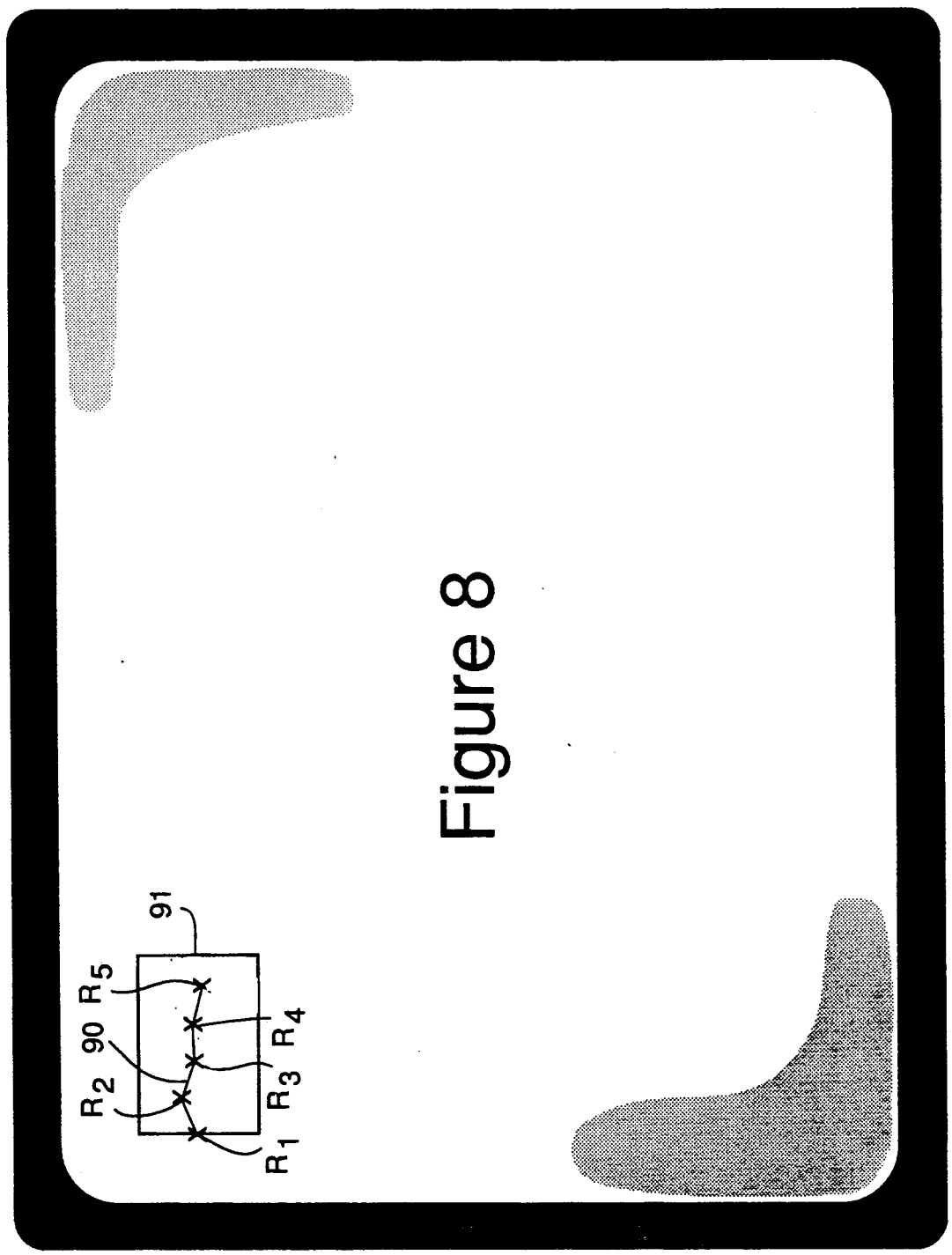

In FIG. 8, running averages $R_4$ and $R_5$ are displayed. When $R_4$ is displayed, box 91 is not erased since $R_4$ is not to the right of the right side of box 91. As long as $|R_1-R_4| < H/2$ and $Y_{91}*I \leq W$, then $R_4$ will remain in box 91. If $R_1 < R_4 - H/2$ then $R_4$ will be above box 91 and the slope of signal 90 will be considered to be positive. If $R_2 > R_4 + H/2$ then $R_4$ will be below box 91 and the slope of signal 90 will be considered to be negative. Similarly, when $R_5$ is displayed, box 91 is not erased since $R_5$ is not to the right of the right side of box 91. As long as $|R_1-R_5| < H/2$, then $R_5$ will remain in box 91. If $R_1 < R_5 - H/2$ than $R_5$ will be above box 91 and the slope of signal 90 will be considered to be positive. If $R_1 > R_5 + H/2$ than $R_5$ will be below box 91 and the slope of signal 90 will be considered to be negative.

Figure 9:
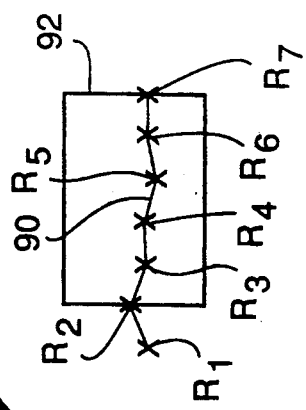

In FIG. 9, running averages $R_6$ and $R_7$ are displayed. When $R_6$ is displayed, box 91 is not erased since $R_6$ is not to the right of the right side of box 91. As long as $|R_1-R_6| < H/2$ and $Y_{91}*I \leq W$, then $R_6$ will remain in box 91. If $R_1 < R_6 - H/2$ than $R_6$ will be above box 91 and the slope of signal 90 will be considered to be positive. If $R_1 > R_6 + H/2$ than $R_6$ will be below box 91 and the slope of signal 90 will be considered to be negative. However, when $R_7$ is displayed, box 91 is no longer able to contain all the displayed running averages ($Y_{91}*I > W$). Box 91 is therefore erased and a new box 92 is displayed so that the center of the left side of box 92 is at $R_2$. As long as $|R_2-R_7| < H/2$ and $Y_{92}*I \leq W$, then $R_7$ will remain in box 92. If $R_2 < R_7 - H/2$ then $R_7$ will be above box 92 and the slope of signal 90 will be considered to be positive. If $R_2 > R_7 + H/2$ then $R_7$ will be below box 92 and the slope of signal 90 will be considered to be negative. Computer 21 is still waiting for a negative slope.

Figure 10:
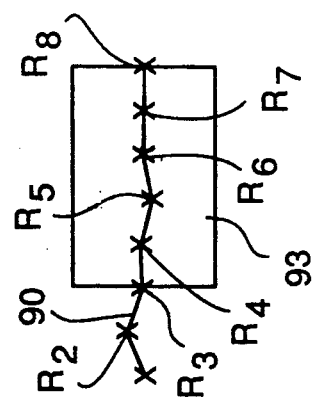

In FIG. 10 a running average $R_8$ is displayed. When $R_8$ is displayed, $Y_{92}*I > W$, so box 92 is erased and a new box 93 is displayed so that the center of the left side of box 93 is at $R_3$. As long as $|R_3-R_8| < H/2$ and $Y_{93}*I \leq W$, then $R_8$ will remain in box 93. If $R_3 < R_8 - H/2$ than $R_8$ will be above box 93 and the slope of signal 90 will be considered to be positive. If $R_3 > R_8 + H/2$ than $R_8$ will be below box 93 and the slope of signal 90 will be considered to be negative.

Figure 11:
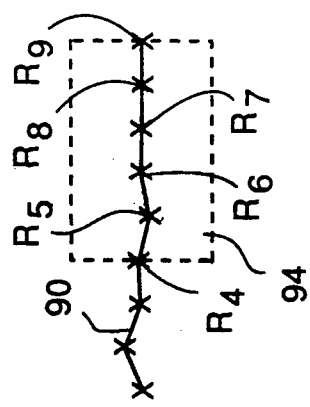

In FIG. 11 a running average $R_9$ is displayed. When $R_9$ is displayed, $Y_{93}*I > W$, so box 93 is erased and a new box 94 is displayed so that the center of the left side of box 94 is at $R_4$. As long as $R_4-R_9 < H/2$ and $Y_{94}*I \leq W$, then $R_9$ will remain in box 94. If $R_4 < R_9 - H/2$ then $R_9$ will be above box 94 and the slope of signal 90 will be considered to be positive. If $R_4 > R_9 + H/2$ then $R_9$ will be below box 94 and the slope of signal 90 will be considered to be negative.

Figure 12:
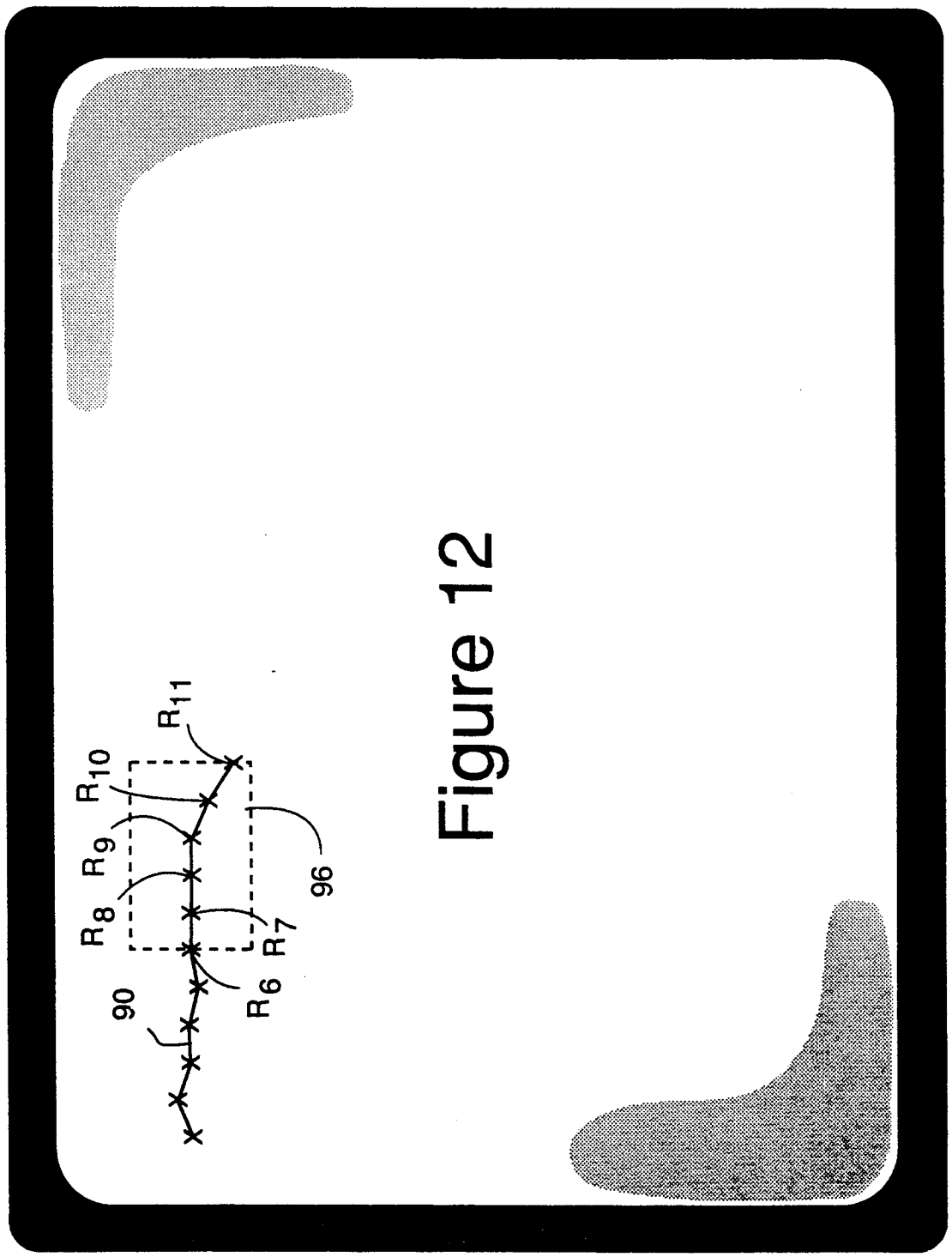

In FIG. 12 running averages $R_{10}$ and $R_{11}$ are displayed. When $R_{10}$ is initially displayed, box 94 is erased and a new box is displayed so that the center of the left side of the new box is at $R_5$. When $R_{11}$ is displayed, the new box is erased and another new box 96 is displayed so that the center of the left side of box 96 is at $R_6$. Computer 21 is still waiting for a negative slope.

Figure 13:
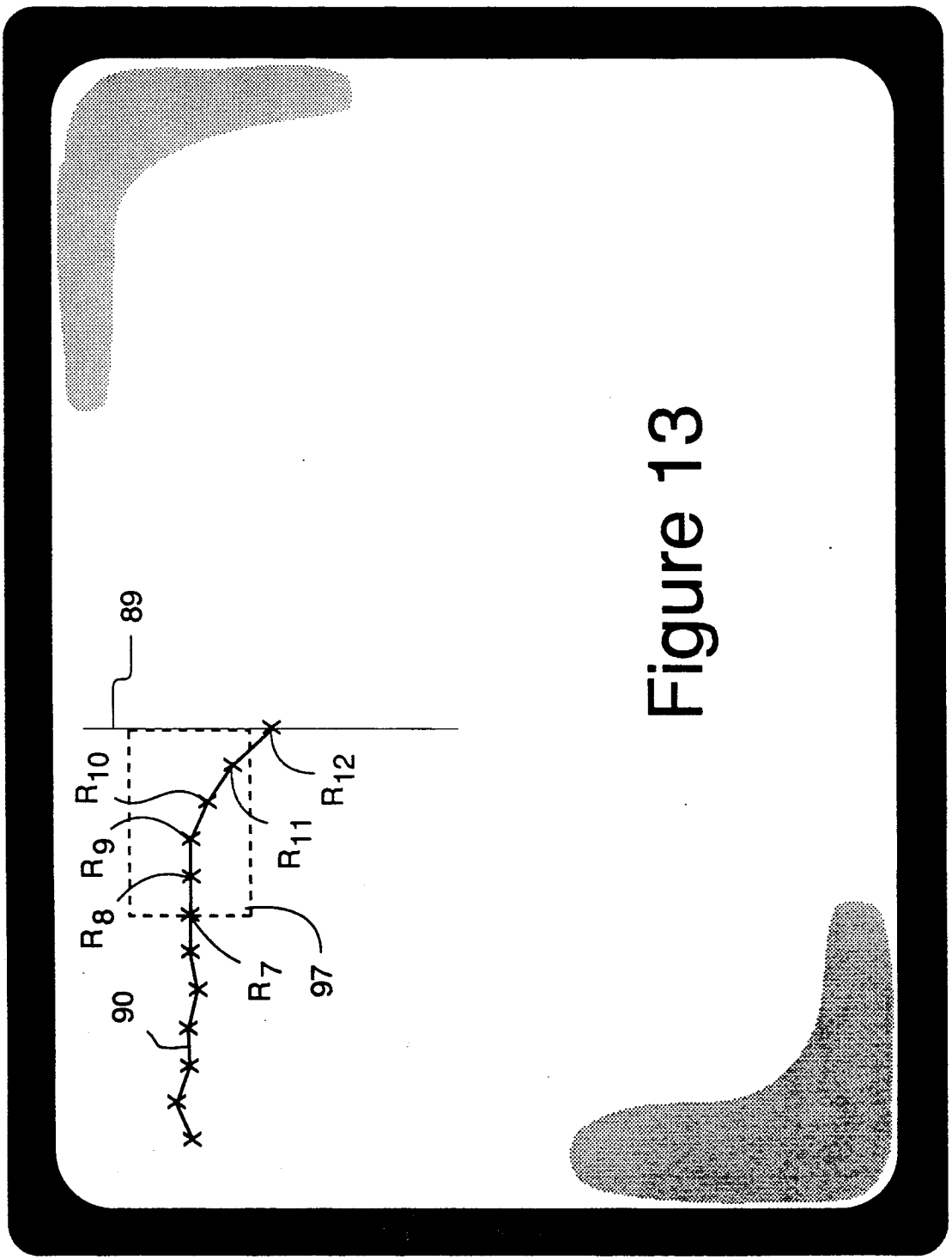

In FIG. 13 a running average $R_{12}$ is displayed. When $R_{12}$ is displayed, box 96 is erased and a new box 97 is displayed so that the center of the left side of box 97 is at $R_7$. Since $R_7 > R_{12} + H/2$, $R_{12}$ is below box 97 and the slope of signal 90 is considered to be negative. This satisfies the condition waited for by computer 21. At this point, box 97 is highlighted, for example, by changing the color of box 97. This indicates to those watching the display the point at which the slope of signal 90 becomes negative. Computer 21 is now waiting for a zero slope.

In the present example, one box which has a negative slope is sufficient to fulfill the condition. Computer 21 may also wait for two or more consecutive negative slopes before indicating that the condition has been fulfilled. In this case, each of the consecutive boxes in which the condition is fulfilled may be highlighted and left unerased.

Since the waited for condition was fulfilled by running average $R_{12}$, a vertical line 89 is drawn through $R_{12}$, indicating a change in slope.

Figure 14:
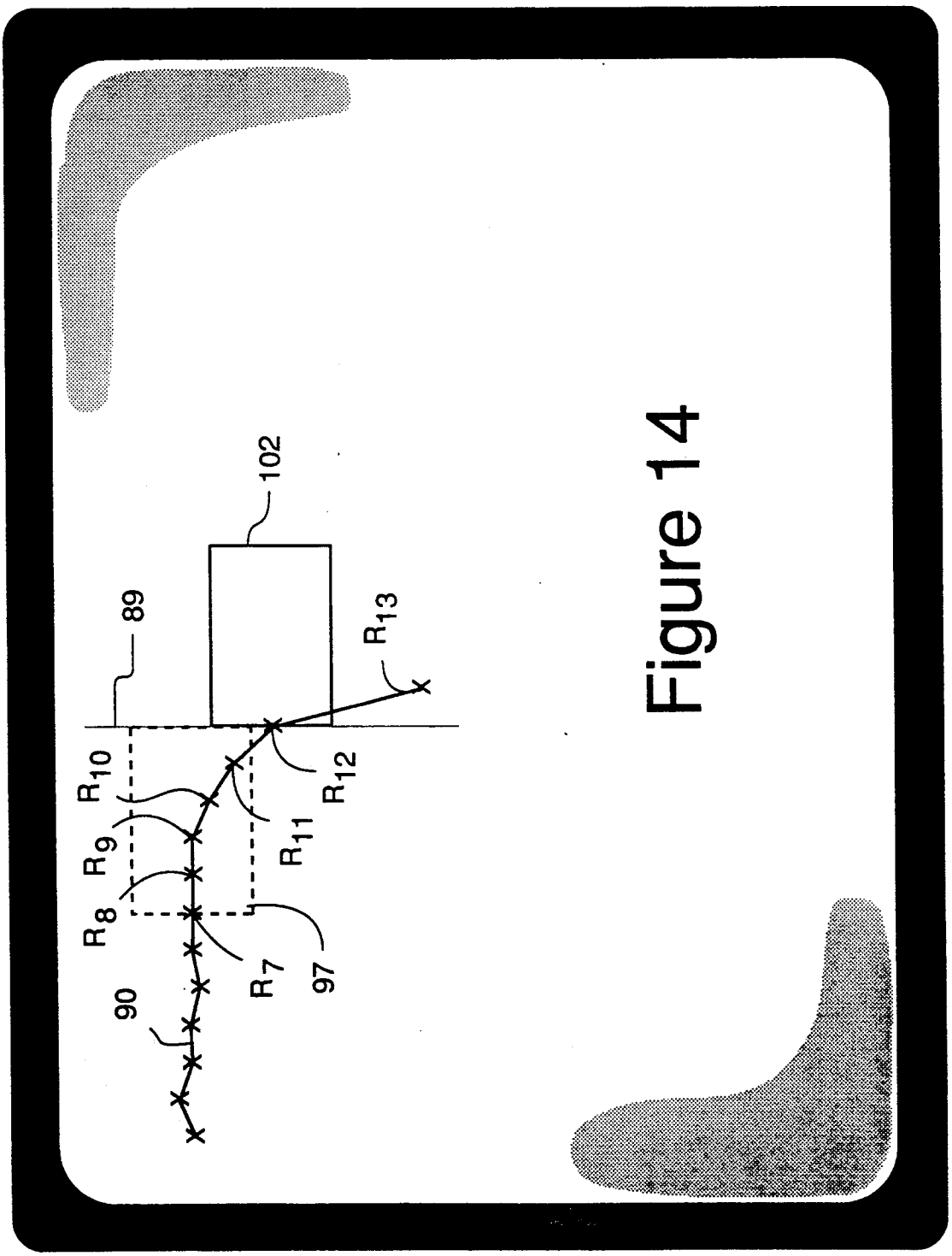

In FIG. 14, a running average $R_{13}$ is displayed. When $R_{13}$ is displayed, a new box 102 is displayed so that the center of the left side of box 102 is at $R_{12}$. Since box 97 fulfilled the waited for condition of a negative slope, the left side of the next box (box 102) is at the point at which signal 90 exited box 97, i.e., $R_{12}$. Box 97 is not erased because it indicates the point at which the slope of signal 90 became negative, satisfying the condition first waited for by computer 21. Since $R_{12} > R_{13} + H/2$, $R_{13}$ is below box 98 and the slope of signal 90 remains negative. The condition waited for now is a zero slope; therefore, box 102 is not highlighted.

Figure 15:
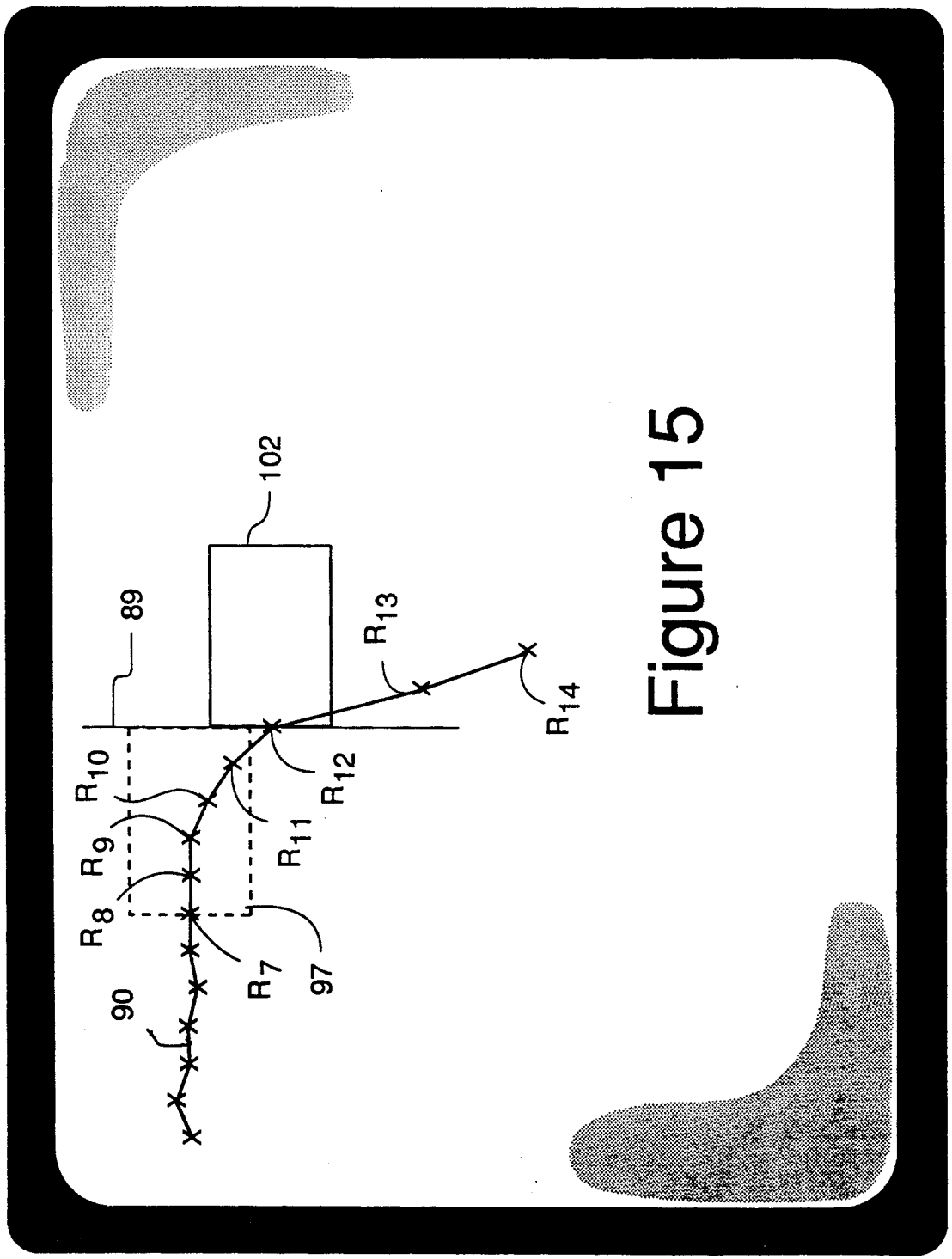

In FIG. 15, a running average $R_{14}$ is displayed. When $R_{14}$ is displayed, box 102 remains since the condition of a zero slope has not been met and $Y_{102}*I \leq W$. Since $R_{12} > R_{14} + H/2$, $R_{14}$ is below box 99 and the slope of signal 90 remains negative. Box 99, therefore, is not highlighted.

Figure 16:
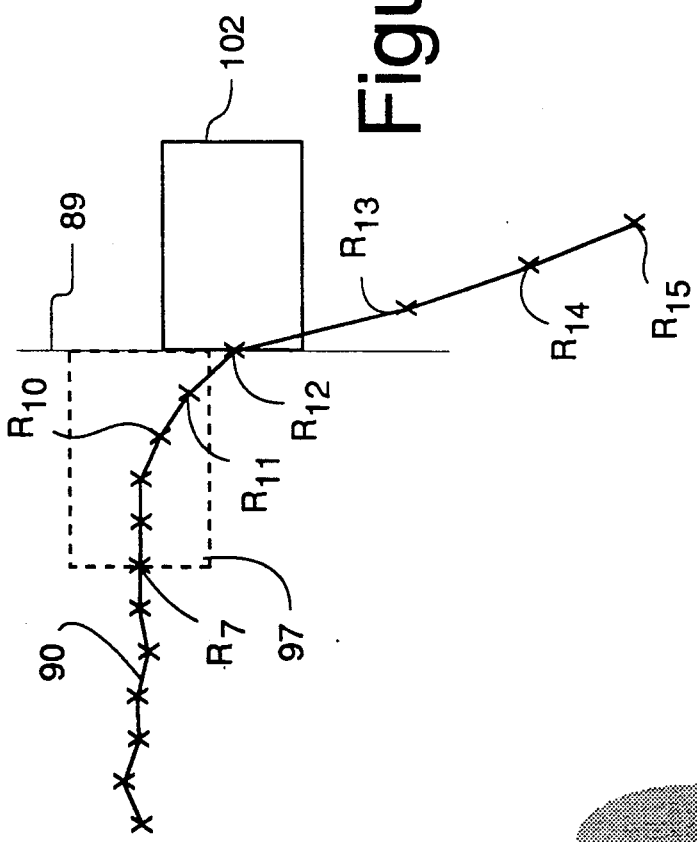

In FIG. 16 a running average $R_{15}$ is displayed. Box 102 remains displayed. Since $R_{12} > R_{15} + H/2$, $R_{15}$ is below box 102 and the slope of signal 90 remains negative. Box 102, therefore, is not highlighted.

Figure 17:
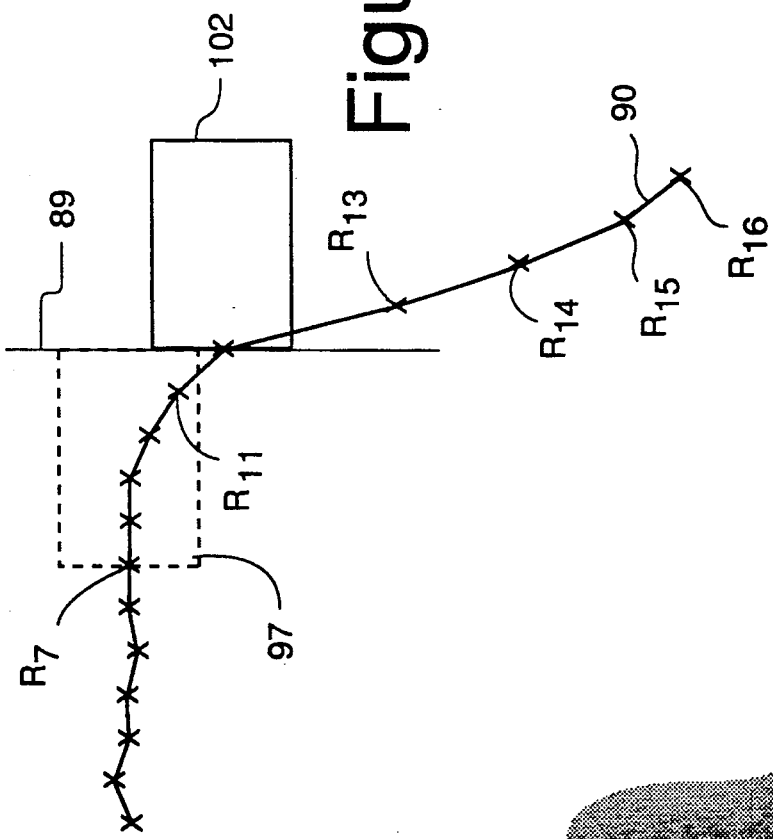

In FIG. 17 a running average $R_{16}$ is displayed. When $R_{16}$ is displayed, box 102 remains displayed. Since $R_{12} > R_{16} + H/2$, $R_{16}$ is below box 102 and the slope of signal 90 remains negative. Box 102, therefore, is not highlighted.

Figure 18:
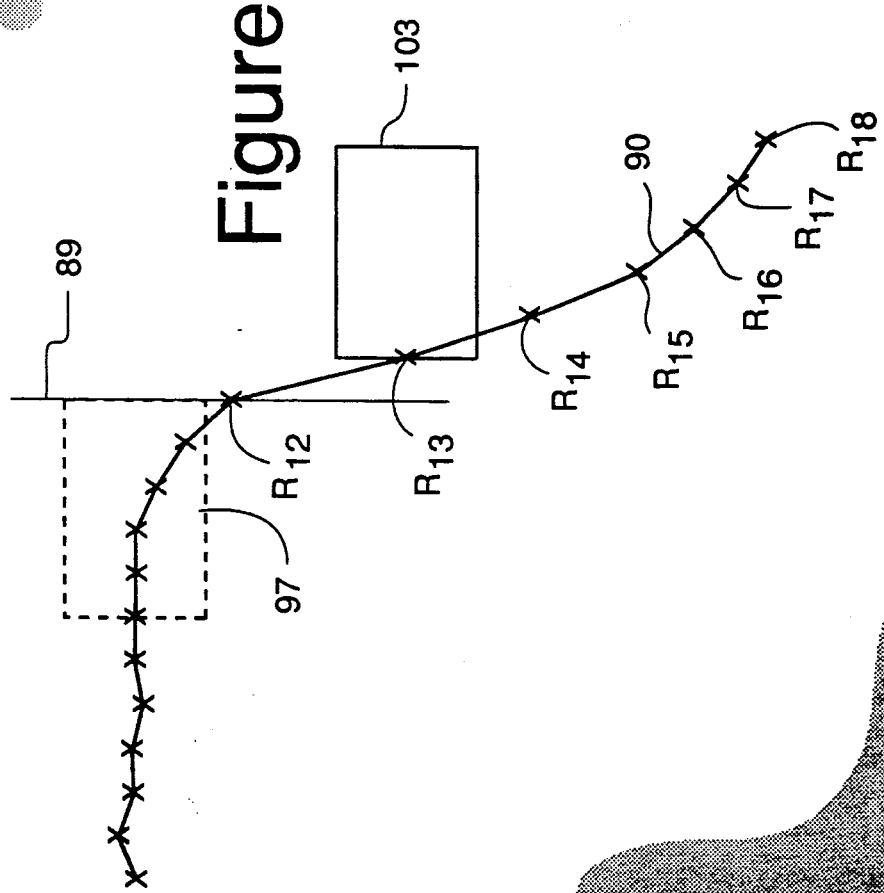

In FIG. 18, running averages $R_{17}$ and $R_{18}$ are displayed. When $R_{17}$ is displayed box 102 remains displayed. When $R_{18}$ is displayed, $Y_{102} * I > W$, therefore, box 102 is erased and a new box 103 is displayed so that the center of the left side of box 103 is at $R_{13}$. Since $R_{13} > R_{18} + H/2$, $R_{18}$ is below box 103 and the slope of signal 90 remains negative. Box 103, therefore, is not highlighted.

Figure 19:
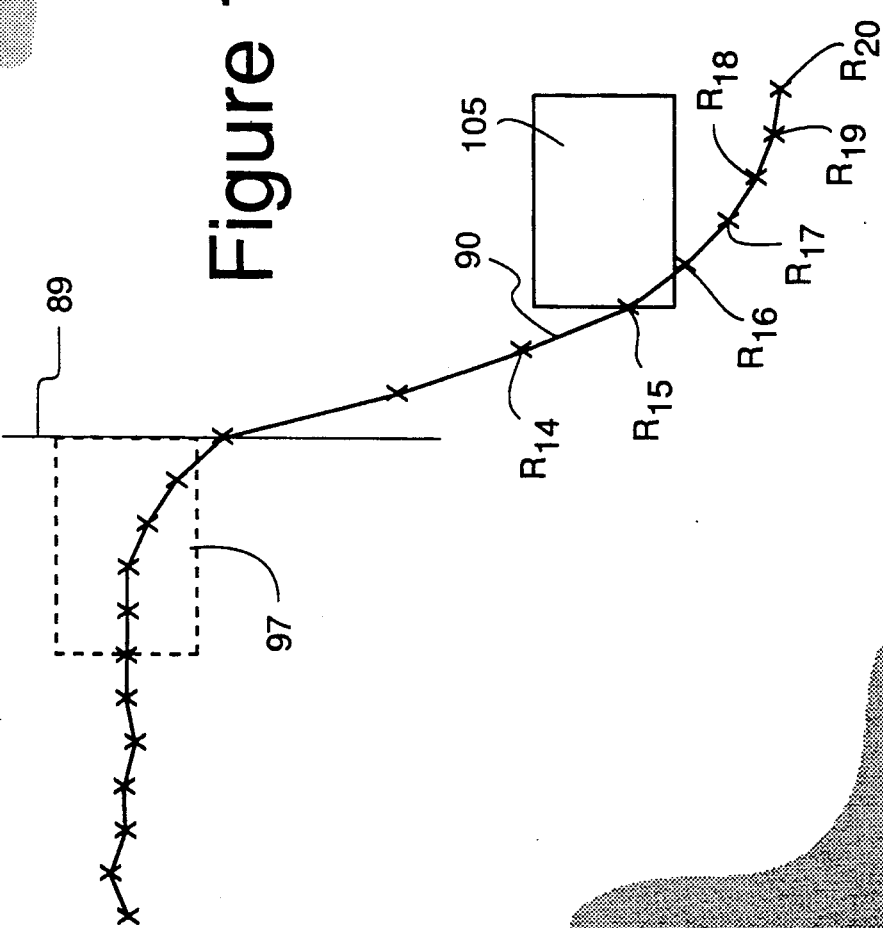

In FIG. 19, running averages $R_{19}$ and $R_{20}$ are displayed. When $R_{19}$ is displayed, box 103 is erased and a new box is displayed so that the center of the left side of the new box is at $R_{14}$. When $R_{20}$ is displayed, the new box is erased and another new box 105 is displayed so that the center of the left side of box 105 is at $R_{15}$. Since $R_{15} > R_{20} + H/2$, $R_{20}$ is below box 105 and the slope of signal 90 remains negative. Box 105, therefore, is not highlighted.

Figure 20:
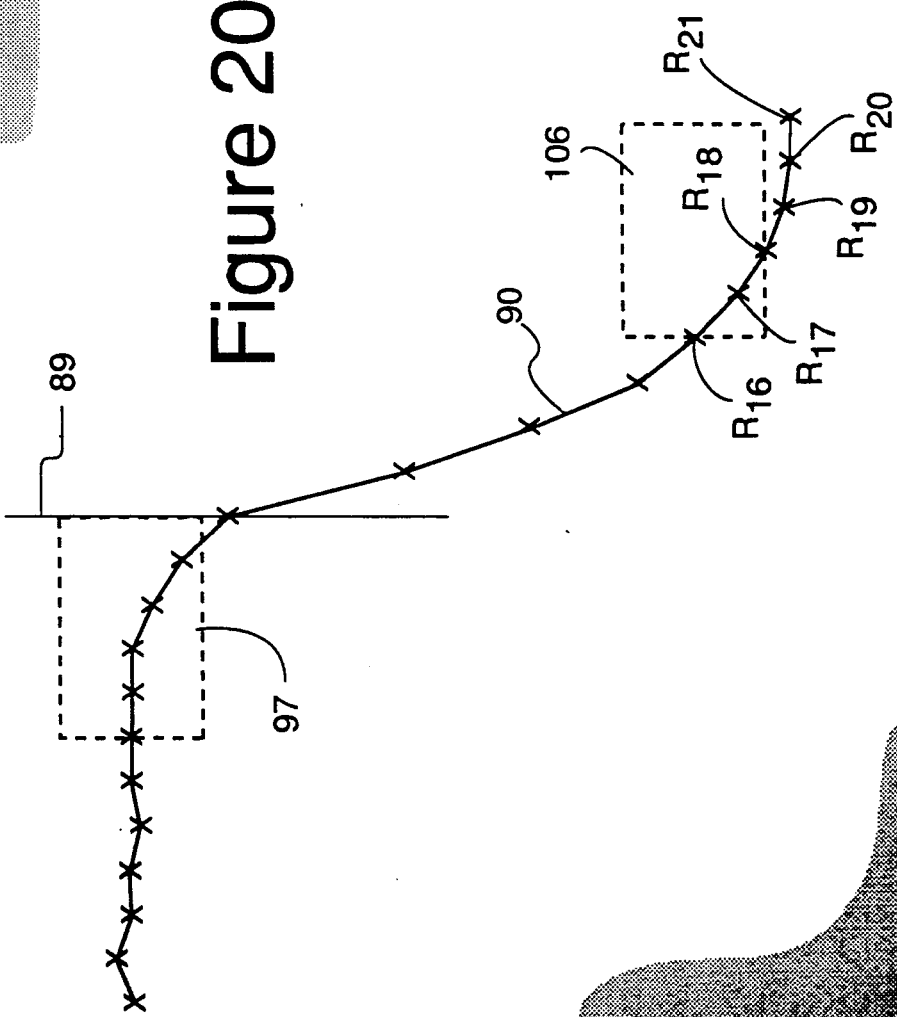

In FIG. 20, a running average $R_{21}$ is displayed. When $R_{21}$ is displayed, box 105 is erased and a new box 106 is displayed so that the center of the left side of box 106 is at $R_{16}$. Since $R_{16} > R_{21} + H/2$, $R_{21}$ is below box 106 and the slope of signal 90 remains negative. Box 106, therefore, is not highlighted.

Figure 21:
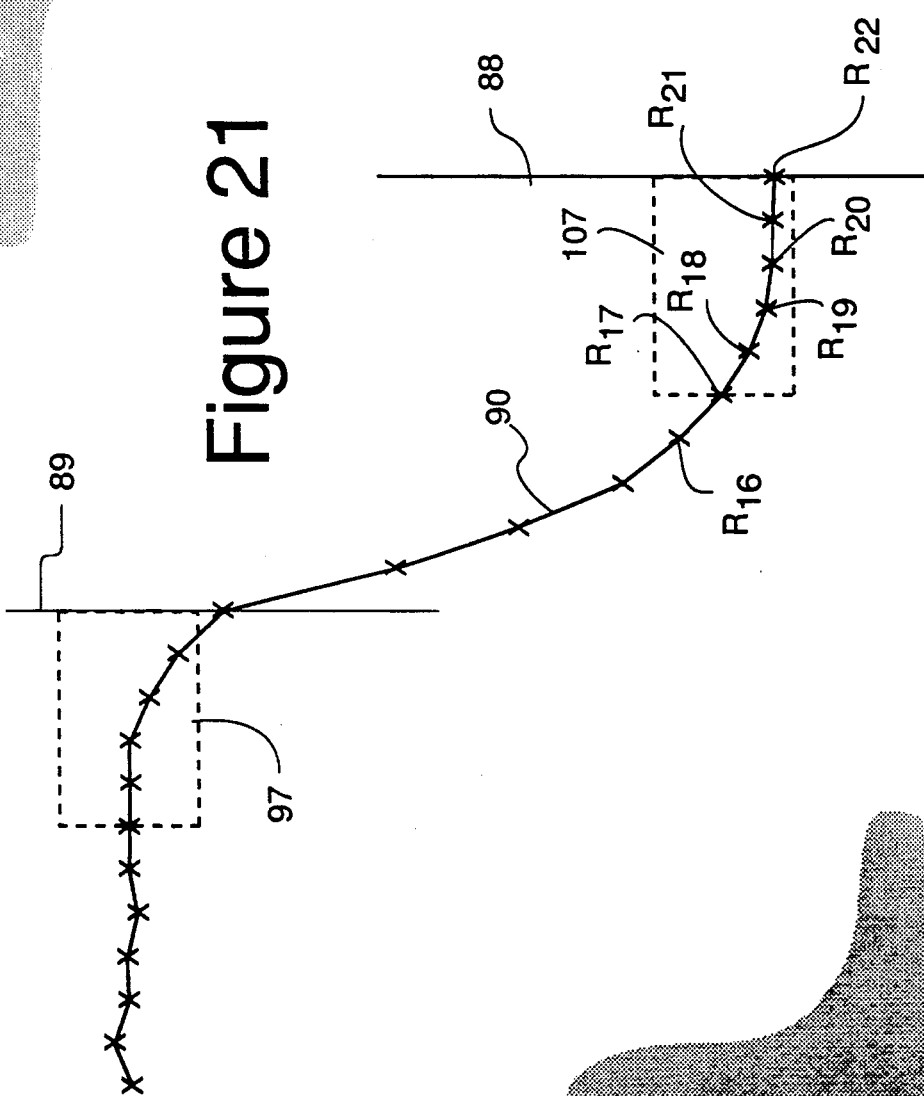

In FIG. 21, a running average $R_{22}$ is displayed. When $R_{22}$ is displayed, a new box 107 is displayed so that the center of the left side Of box 107 is at $R_{17}$. Since $|R_{17} - R_{22}| < H/2$, $R_{22}$ is within box 107 and the slope at $R_{22}$ is zero. This is the condition computer 21 has been waiting for. Box 107, therefore, is highlighted. Box 106 is erased as it is the last box with a negative slope. Since box 107 is the first box to satisfy the condition sought by computer 21, it will not be erased. Computer 21 could be programmed to leave unerased a box which was a predetermined number of boxes after box 107 along with or instead of highlighting box 107. In the present example, only the box in which a condition is first satisfied remains unerased.

A vertical line 88 which intersects $R_{22}$ is added to indicate that the slope became zero at $R_{22}$.

Figure 22:
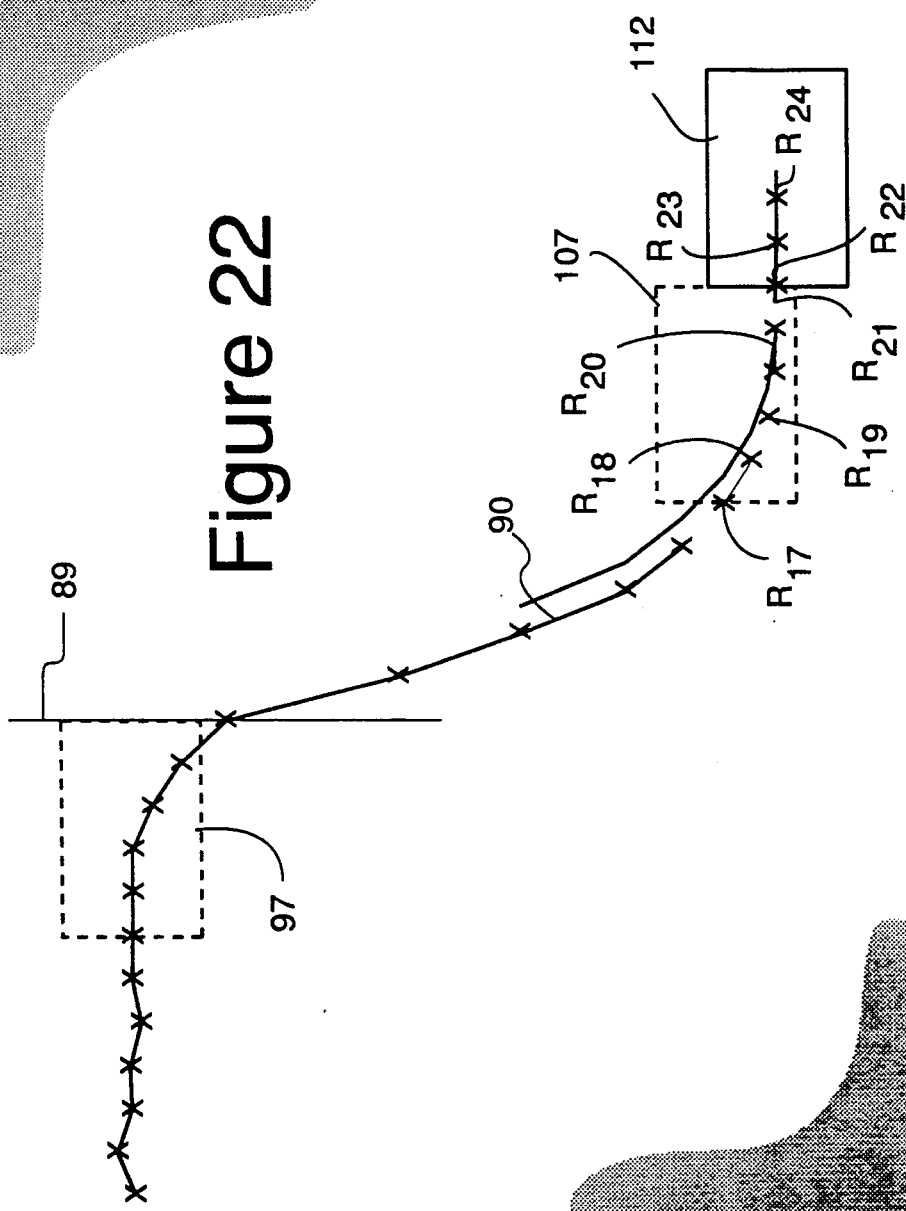

In FIG. 22, running averages $R_{23}$ and $R_{24}$ are displayed. When $R_{23}$ is displayed, a new box 112 is displayed so that the center of the left side of box 109 is at $R_{22}$. This is because $R_{22}$ was the location where signal 90 exited a box and fulfilled a waited for condition. $R_{22} < R_{24} + H/2$; therefore, $R_{24}$ is within box 112. No condition is waited for and therefore box 109 is not highlighted.

Figure 23:
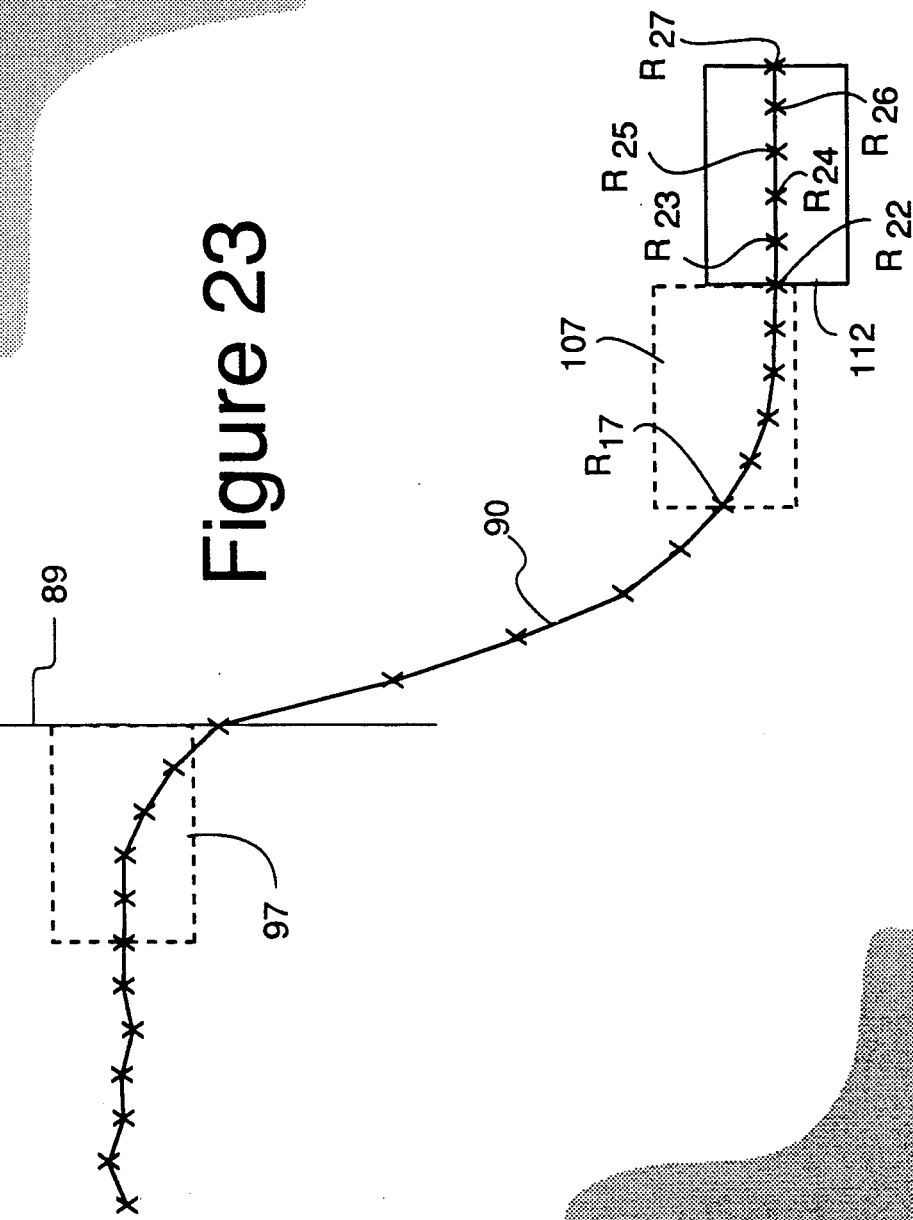

In FIG. 23, running averages $R_{25}$, $R_{26}$ and $R_{27}$ are displayed. Box 112 is displayed and not highlighted.

In order to change the location where the box method records a negative or positive slope, the value of width W and height H may be changed. When the above box method is used to determine critical stages of a process, computer 21 may store the data received from counter 26 in a file. This data may then be utilized by an operator to make many simulated runs of the process. The width W and height H of the box can be adjusted until the box will become highlighted at precisely the point desired by the operator. The width W and height H determined by the operator can be used by computer 21 to control real time processes.

The box method can be used to detect several critical stages in a single process requiring a controller of the process to take action. Computer 21 can be programmed to look for any combination of a positive slope, negative slope or zero slope. For example, in FIG. 24 a signal 120 is shown. For a process such as that represented by FIG. 24, it may be desirable to detect six changes in slope. Computer 21 would be programmed to look first for a negative slope, second for a zero slope, third for a negative slope, fourth for a zero slope, fifth for a positive slope and sixth for a zero slope.

Figure 24:
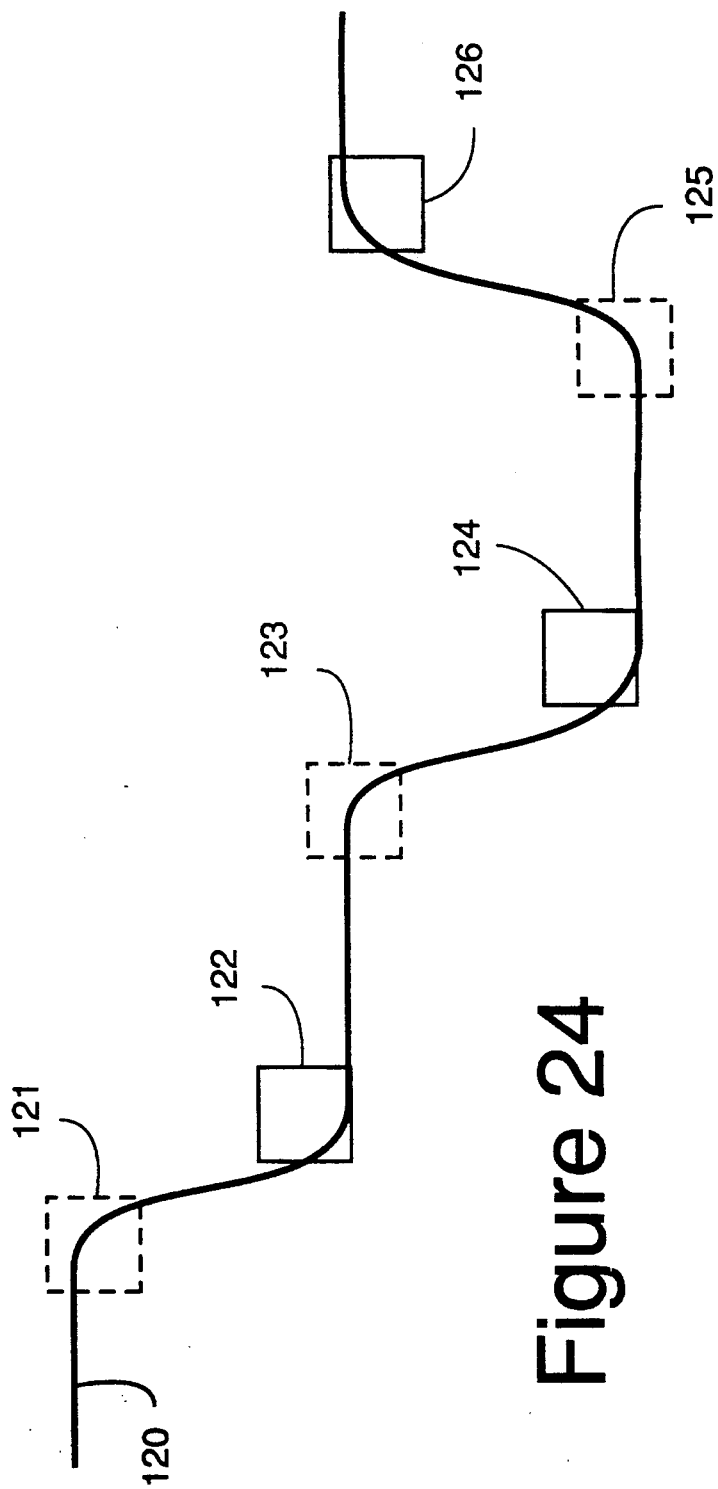
FIG. 24 gives a second example of the use of the box method in accordance with the preferred embodiment of the present invention.

In FIG. 24, six boxes indicate a change of slope in signal 120. A box 121 indicates the start of a negative slope. Box 122 indicates the start of a zero slope. A box 123 indicates the start of a negative slope. Box 124 indicates the start of a zero slope. A box 125 indicates the start of a positive slope. Box 126 indicates the start of a zero slope.

Upon finding the last zero slope, computer 21 would know that it has reached the end point of the process. Any of the detected changes in slope could signal computer 21 to intervene in some way in the process. Additionally, instead of intervening or marking signal 120 at first detection of a change in slope, computer 21 could wait one, two, three or etc, boxes after a change in slope is detected or could wait an additional percentage of the real time from the beginning of the plasma process on to each end point before intervening in the process.

I claim:

1. An apparatus for displaying a filtered signal which represents the variation of light intensity in a processing chamber over time wherein a magnetic field generated by a signal which a period T causes plasma to rotate within the processing chamber, the apparatus comprising:
   (a) detecting means, coupled to the processing chamber, for detecting the light intensity within the process chamber to produce a voltage signal with a voltage amplitude varying based on the light intensity within the process chamber;
   (b) sampling means, coupled to the detecting means, for digitally sampling the voltage amplitude of the voltage signal at a sampling interval (I) to obtain sample values ($S_x$);
   (c) calculating means, coupled to the sampling means, for calculating running averages ($R_y$) of a preselected number (N) of sample values ($S_x$);
   (d) magnetic signal frequency adjusting means, coupled to the processing chamber, for setting the period T equal to the preselected number (N) times the sampling interval (I) times an integer;
   (e) display means for displaying in a graph sequential values of the running averages along a y-axis versus time along an x-axis and for highlighting a change in the slope of the graph; and
   (f) means for changing the processing conditions within said chamber in response to step (e).

2. An apparatus as in claim 1 wherein the sampling means includes:
   converting means for converting the voltage signal to a frequency signal having a frequency which varies in accordance with the voltage amplitude of the voltage signal;
   counter means, coupled to the converting means, for storing a running total of pulses of the frequency signal in a counter; and, computer means, coupled to the counter means, for sampling and clearing the counter to obtain the sample values.

3. An apparatus as in claim 1 wherein the calculating means calculates the running averages ($R_y$) using the following formula:

$$R_i = (S_i + S_{i+1} + \ldots + S_{N+i})/N.$$

4. A method for displaying a filtered signal which represents the variation of light intensity in a processing chamber over time wherein a magnetic field generated by a signal with a period R causes plasma to rotate within the processing chamber, the method comprising the steps of:
   (a) detecting the light intensity within the process chamber to produce a voltage signal with a voltage amplitude varying with the light intensity within the process chamber;
   (b) digitally sampling the voltage amplitude of the voltage signal at a sampling interval (I) to obtain sample values ($S_x$);
   (c) calculating running averages ($R_y$) of a preselected number (N) of sample values ($S_x$);
   (d) setting the period T equal to the preselected number (N) times the sampling interval (I) times an integer;
   (e) displaying in a graph sequential values of the running averages along a y-axis versus time along an x-axis;
   (f) superimposing over the graph a rectangular box having a height H representing an amount of light intensity extending in the direction of the y-axis, and a width W representing an amount of time extending in the direction of the x-axis that includes earlier displayed running averages and placed so that the midpoint of the left side of the rectangular box is coincident with an earlier displayed running average;
   (g) waiting for one of a positive slope, a negative slope and a zero slope;
   (h) detecting whether a newly displayed running average exits to the right of the rectangular box, above the rectangular box or below the rectangular box;
   (i) when the newly displayed discrete value of the running average is at the right of the rectangular box, designating the slope of the graph at the discrete value as having a zero slope;
   (j) when the newly displayed discrete value of the running average is above the rectangular box, designating the slope of the graph at the discrete value as having a positive slope;
   (k) when the newly displayed discrete value of the running average is below the rectangular box, designating the slope of the graph at the discrete value as having a negative slope; and
   (l) highlighting the rectangular box when the slope designated in steps (i), (j) and (k) is the waited for slope of step (g).

5. A method as in claim 4 wherein step (b) includes the substeps of:
   (b1) converting the voltage signal to a frequency signal having a frequency which varies in accordance with the voltage amplitude of the voltage signal;
   (b2) storing a running total of pulses of the frequency signal in a counter; and,
   (b3) sampling and clearing the counter to obtain the sample values.

6. A method as in claim 4 wherein in step (c) the running averages ($R_y$) are calculated using the following formula:

$$R_i = (S_i + S_{i+1} + \ldots + S_{N+i})/N.$$

7. A method as in claim 4 additionally comprising the following step of:
   (m) upon displaying a next rectangular box, erasing an immediately prior rectangular box except when the immediately prior rectangular box is highlighted.

8. A method as in claim 4 wherein the highlighting in step (l) is done by displaying the rectangular box in a different color than non-highlighted rectangular boxes.

9. A method for displaying a signal which represents discrete values of a variable versus time, the method comprising the steps of:
   (a) displaying sequentially, on a graph, discrete values of the variable at specific instances of time along a y-axis wherein passage of time is measured along an x-axis;
   (b) superimposing over the graph a rectangular box having a height H extending in the direction along the y-axis, and a width W representing an amount of time extending along the direction of the x-axis so that the rectangular box includes earlier displayed discrete values and placed so that the midpoint of the left side of the rectangular box is coincident with an earlier displayed discrete value;
   (c) detecting whether a newly displayed discrete value is at the right of the rectangular box indicating a zero change in slope of the graph, above the rectangular box indicating a positive change in slope of the graph or below the rectangular box indicating a negative change in slope of the graph; and,
   (d) highlighting the rectangular box when a change of slope is indicated.

10. A method as in claim 9 additionally comprising the following step:
    (e) upon displaying a next rectangular box, erasing an immediately prior rectangular box except when the immediately prior rectangular box is highlighted.

11. A method as in claim 9 wherein the highlighting in step (d) is done by displaying the rectangular box in a different color than non-highlighted rectangular boxes.

12. A method for displaying a signal which represents discrete values of a variable versus time, the method comprising the steps of:
    (a) displaying, on a graph, discrete values of the variable at specific instances of time along a y-axis wherein passage of time is measured along an x-axis;
    (b) for each newly displayed discrete value, superimposing over the graph a rectangular box having height H extending in the direction along the y-axis, and width W extending along the direction of the x-axis that includes earlier displayed discrete values and placed so that the midpoint of the left side of the rectangular box is coincident with an earlier displayed discrete value;
    (c) when a newly displayed discrete value is at the right of the rectangular box, designating the slope of the graph at the discrete value as having a zero slope;

(d) when a newly displayed discrete value is above the rectangular box, designating the slope of the graph at the discrete value as having a positive slope; and (e) when the newly displayed discrete value is below the rectangular box, designating the slope of the graph at the discrete value as having a negative slope.

13. A method as in claim 12 additionally comprising the step of:

(f) selecting parameters including height (H) of the rectangle, width (W) of the rectangular box, and a sequence of anticipated slopes;

(g) highlighting rectangular boxes for a displayed discrete value which indicates a beginning of a slope in the sequence of anticipated slopes; and, (h) erasing rectangular boxes not highlighted.

14. A method as in claim 13 wherein highlighting is done by selection of colors for rectangular boxes.

15. A method as in claim 12 wherein step (b) includes the substeps of:

(b1) when the newly displayed discrete value displayed is within a distance along the x-axis equal to width (W) from the first discrete value displayed and a first slope in the sequence of anticipated slope has not been detected, superimposing the rectangular box so that the first discrete value bisects a left side of the rectangular box, and (b2) when the newly displayed discrete value displayed is not within a distance along the x-axis equal to width (W) from the first discrete value displayed, superimposing the rectangular box so that a discrete value which, along the x-axis, is width (W) to the left of the newly displayed discrete value displayed bisects the left side of the rectangular box.

* * * * *